United States Patent
Sakaue et al.

(10) Patent No.: US 10,725,603 B2
(45) Date of Patent: Jul. 28, 2020

(54) METHOD FOR MANUFACTURING TOUCH PANEL

(71) Applicant: JAPAN AVIATION ELECTRONICS INDUSTRY, LIMITED, Tokyo (JP)

(72) Inventors: Akitoshi Sakaue, Tokyo (JP); Kenji Matsumoto, Tokyo (JP); Yutaka Takezawa, Tokyo (JP); Yuta Hasegawa, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 0 days.

(21) Appl. No.: 16/173,379

(22) Filed: Oct. 29, 2018

(65) Prior Publication Data
US 2019/0138137 A1   May 9, 2019

(30) Foreign Application Priority Data

Nov. 6, 2017   (JP) .................................. 2017-213498

(51) Int. Cl.
*G06F 3/041*   (2006.01)
*G06F 3/045*   (2006.01)
(Continued)

(52) U.S. Cl.
CPC ............ *G06F 3/047* (2013.01); *G06F 3/0445* (2019.05); *G06F 3/0446* (2019.05);
(Continued)

(58) Field of Classification Search
CPC ...................................................... G06F 3/044
See application file for complete search history.

(56) References Cited

U.S. PATENT DOCUMENTS

| 2007/0007883 | A1* | 1/2007 | Takeda ...................... B41M 1/10 |
| | | | 313/503 |
| 2015/0352829 | A1* | 12/2015 | Sente ........................ B41M 1/10 |
| | | | 101/153 |
| 2019/0227672 | A1* | 7/2019 | Nishimura .............. G06F 3/041 |

FOREIGN PATENT DOCUMENTS

| JP | 2015-143978 A | 8/2015 |
| JP | 2016-071629 A | 5/2016 |

(Continued)

OTHER PUBLICATIONS

Office Action issued in Taiwan family member Patent Appl. No. 107138742, dated May 30, 2019, along with an English translation thereof.

(Continued)

*Primary Examiner* — Nan-Ying Yang
(74) *Attorney, Agent, or Firm* — Greenblum & Bernstein, P.L.C.

(57) ABSTRACT

A method for manufacturing a touch panel having a sensing area that includes a conductive part made up of thin-line mesh includes a step of designing the thin-line mesh, the thin-line mesh including a plurality of intersections, wherein the intersection forms therearound an acute angular area and an obtuse angular area, the acute angular area being defined between a pair of adjacently converging thin lines that forms an acute angle therebetween, the obtuse angular area being defined between a pair of adjacently converging thin lines that forms an obtuse angle therebetween, a step of filling electrically conductive ink into a printing plate by a squeezing process using a doctor blade, the printing plate having a groove pattern that conforms with the thin-line mesh, and a step of forming the conductive part by printing, in which the electrically conductive ink is transferred to a surface of a base member.

10 Claims, 9 Drawing Sheets

(51) Int. Cl.
*G06F 3/047* (2006.01)
*H05K 3/12* (2006.01)
*G06F 3/044* (2006.01)

(52) U.S. Cl.
CPC . *H05K 3/1275* (2013.01); *G06F 2203/04103* (2013.01); *G06F 2203/04112* (2013.01)

(56) References Cited

FOREIGN PATENT DOCUMENTS

| | | | |
|---|---|---|---|
| JP | 2017-103317 | A | 6/2017 |
| KR | 10-1449493 | B1 | 10/2014 |
| TW | 201327585 | A | 7/2013 |
| TW | 201345985 | A | 11/2013 |
| TW | 201408152 | A | 2/2014 |
| TW | 201438534 | A | 10/2014 |
| TW | 201721260 | A | 6/2017 |

OTHER PUBLICATIONS

Office Action issued in Republic of Korea family member Patent Appl. No. 10-2018-0131755, dated Mar. 30, 2020, along with an English translation thereof.

\* cited by examiner

METHOD FOR MANUFACTURING TOUCH PANEL

TECHNICAL FIELD

The present invention relates to a method for manufacturing a touch panel having a sensing area that includes a conductive part made up of thin-line mesh.

BACKGROUND ART

FIG. 1, FIG. 2A, and FIG. 2B show, as a conventional example of the structure of a touch panel, the structure of a capacitive touch panel described in Japanese Patent Application Laid Open No. 2017-103317 (issued on Jun. 8, 2017). This touch panel has a structure in which a first conductive layer, an insulating layer, a second conductive layer, and a protective layer are sequentially laminated on a transparent base member 10. In FIG. 1, an area surrounded by a rectangular frame indicates a sensing area (sensor area) 20 where sensor electrodes are positioned. Details of the sensor electrodes are not shown in FIG. 1.

The sensor electrodes include a first sensor electrode and a second sensor electrode. The first sensor electrode is formed by the first conductive layer, and the second sensor electrode is formed by the second conductive layer.

As shown in FIG. 2A, the first sensor electrode 30 is configured such that a plurality of electrode rows 33 are arranged in rows along the Y direction, which is parallel to the short sides 22 of the sensing area 20, each of the plurality of electrode rows 33 being formed by connecting a plurality of island-shaped electrodes 31 arranged along the X direction, which is parallel to the long sides 21 of the sensing area 20, with connection sections 32.

As shown in FIG. 2B, the second sensor electrode 40 is configured such that a plurality of electrode rows 43 are arranged in rows along the X direction, each of the plurality of electrode rows 43 being formed by connecting a plurality of island-shaped electrodes 41 arranged along the Y direction, with connection sections 42.

The first sensor electrode 30 and the second sensor electrode 40 are individually made up of thin-line mesh. The electrode rows 33 and 43 intersect with each other in an insulated state. The connection sections 32 and 42 are positioned overlappingly.

Lead wiring lines 51 are drawn from both ends, in the X direction, of each of the electrode rows 33 of the first sensor electrode 30. Lead wiring lines 52 are drawn from one-side end, in the Y direction, of each of the electrode rows 43 of the second sensor electrode 40. Among the lead wiring lines 51 and 52 drawn from the sensing area 20 and arranged in rows, only those positioned at both ends are shown in FIG. 1, whereas the others are not shown.

Terminals 53 are formed and arranged at a middle portion along one long side of the base member 10, which is rectangular. The lead wiring lines 51 and 52 are extended to reach and connect to terminals 53. Ground wiring lines 54 are formed at a peripheral part of the base member 10 so as to surround the sensing area 20 and the lead wiring lines 51 and 52. The ground wiring lines 54 are also connected to terminals 53.

The lead wiring lines 51 and 52 and the terminals 53 are formed by the first conductive layer. The ground wiring lines 54 are formed by both the first and second conductive layers.

In this example, the first and second conductive layers, having the above-described structures, are formed by gravure offset printing by the use of electrically conductive ink that includes electrically conductive particles, such as silver particles.

In a touch panel having a sensing area that includes a conductive part made up of thin-line mesh and the conductive part is formed by gravure printing or gravure offset printing by using electrically conductive ink, as described above, blurring of the electrically conductive ink occurs at intersections of the thin-line mesh. Such blurring of the electrically conductive ink is visually recognized, affecting the visibility of a display unit in which the touch panel is arranged, thus reducing the visual quality of the touch panel.

SUMMARY OF THE INVENTION

An object of the present invention is to provide a method for manufacturing a touch panel in which the size of the blurred region of electrically conductive ink, occurring at intersections of thin-line mesh, is reduced, thereby improving the visual quality of the touch panel.

According to the present invention, a method for manufacturing a touch panel having a sensing area that includes a conductive part made up of thin-line mesh comprises a step of designing the thin-line mesh, the thin-line mesh including a plurality of intersections, such that a plurality of thin lines converge at the intersection, wherein the intersection forms therearound an acute angular area and an obtuse angular area, the acute angular area being defined between a pair of adjacently converging thin lines that forms an acute angle therebetween, the obtuse angular area being defined between a pair of adjacently converging thin lines that forms an obtuse angle therebetween, a step of filling electrically conductive ink into a printing plate by a squeezing process using a doctor blade, the printing plate having a groove pattern that conforms with the thin-line mesh, wherein the doctor blade is moved along a squeezing direction, such that an imaginary straight line that passes through the intersection in the thin-line mesh in a direction in accordance with the squeezing direction, passes through not the obtuse angular area but the acute angular area, and a step of forming the conductive part by printing, in which the electrically conductive ink is transferred to a surface of a base member.

In a touch panel having a sensing area that includes a conductive part made up of thin-line mesh, the size of the blurred region of electrically conductive ink, occurring at intersections of thin-line mesh, can be reduced, thereby improving the visual quality of the touch panel manufactured with a touch panel manufacturing method according to the present invention.

DETAILED DESCRIPTION OF THE EMBODIMENTS

First, when thin-line mesh is formed by gravure offset printing by using electrically conductive ink, investigation results of how blurring of the electrically conductive ink that occurs at intersections of the thin-line mesh changes in terms of the relationships with the intersection angle of two thin lines intersecting at each intersection and a squeezing direction of a doctor blade will be described.

Figure 3A:
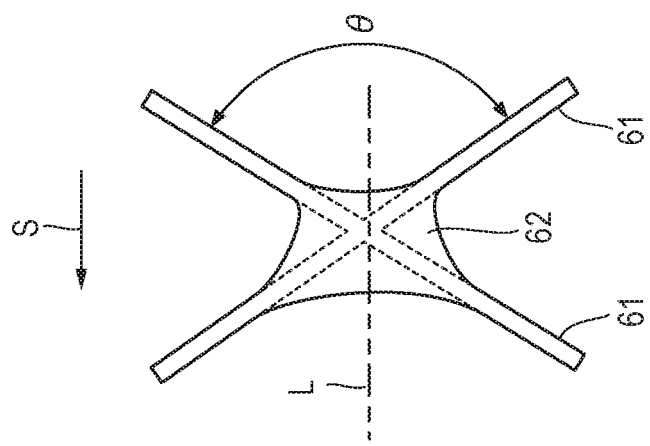
FIG. 3A is a view showing blurring of electrically conductive ink that occurs at an intersection where two thin lines intersect.
Figure 3B:
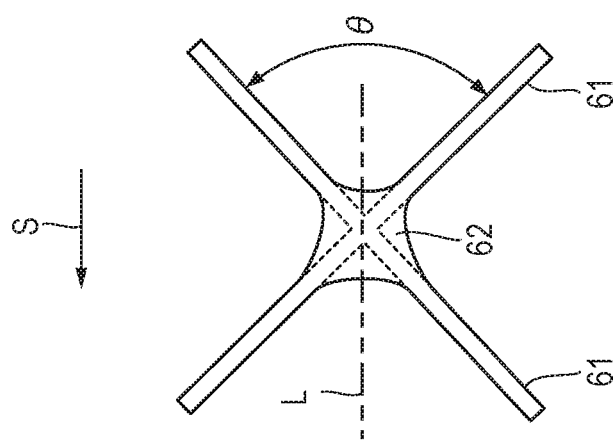
FIG. 3B is a view showing blurring of electrically conductive ink that occurs at an intersection where two thin lines intersect.
Figure 3C:
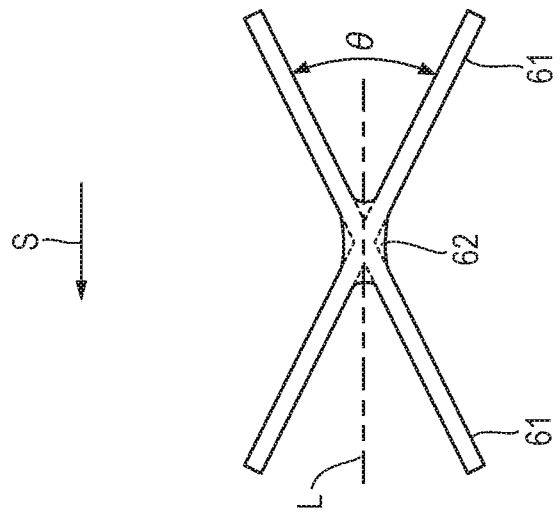
FIG. 3C is a view showing blurring of electrically conductive ink that occurs at an intersection where two thin lines intersect.

FIGS. 3A to 3C respectively show a thin-line mesh intersection where two thin lines intersect. The intersection angle θ of two thin lines 61 shown in the figures is 120 degrees in FIG. 3A, 90 degrees in FIG. 3B, and 60 degrees in FIG. 3C. In FIGS. 3A to 3C, 62 denotes blurring of the electrically conductive ink, S denotes the squeezing direction of the doctor blade, and L denotes an imaginary straight line that passes through the intersection of the two thin lines 61 in a direction in accordance with the squeezing direction S.

Blurring 62 is made at the thin-line mesh intersection like a palmated foot. The area of blurring 62 increases as θ increases, as shown in FIGS. 3A to 3C, when the squeezing direction S is the direction of the arrow. When θ is an obtuse angle, large blurring 62 occurs as shown in FIG. 3A. In contrast, when θ is an acute angle, the blurring 62 is much smaller than when θ is an obtuse angle, as shown in FIG. 3C.

Taking these results into consideration, in this invention, when a touch panel where a sensing area includes a conductive part made up of thin-line mesh is manufactured, an acute angular area where a pair of adjacently converging thin lines forms an acute angle and an obtuse angular area where a pair of adjacently converging thin lines forms an obtuse angle are formed around each of the intersections where a plurality of thin lines converge in the thin-line mesh.

In addition, the conductive part formed of the thin-line mesh that include a plurality of such intersections is formed by gravure printing or gravure offset printing. In other words, the conductive part is formed by printing by transferring, to a surface of a base member, electrically conductive ink filled, by a squeezing process using a doctor blade, into a printing plate (gravure plate) having a groove pattern that conforms with the thin-line mesh. In addition, the squeezing direction of the doctor blade is selected such that the imaginary straight line L that passes through the intersections in the thin-line mesh in the direction in accordance with the squeezing direction S, passes through not the obtuse angular area but the acute angular area formed around the intersection.

When such a method is employed, the size of the blurred region of the electrically conductive ink that occurs at intersections of the thin-line mesh is made much smaller.

One example of thin-line mesh configured by including intersections, such that the intersection forms therearound the acute angular area and the obtuse angular area, as described above, would be a periodic lattice pattern having a rhombus shape containing an opposing pair of the acute angular areas and an opposing pair of the obtuse angular areas, as a unit lattice.

Figure 4:
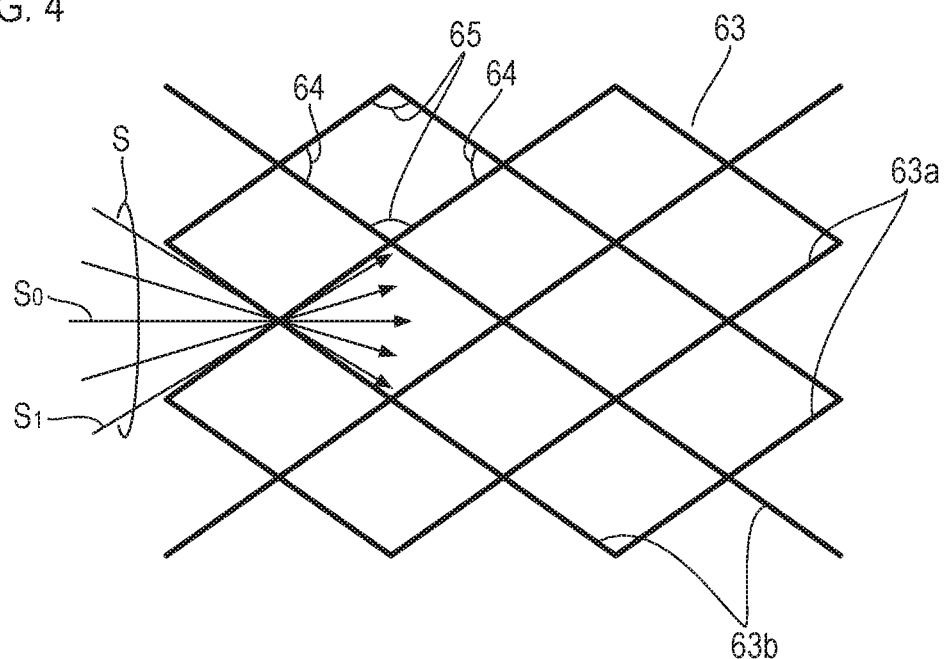
FIG. 4 is a view for explaining squeezing directions when thin-line mesh has a periodic lattice pattern which has a unit lattice having a rhombus shape.

FIG. 4 shows a relationship between the thin-line mesh 63 having the periodic lattice pattern that has such the rhombus shape as the unit lattice and the squeezing direction S. The squeezing direction S is selected in the range of directions shown in FIG. 4, and needs to accord with the direction of the imaginary straight line passing through not the obtuse angular areas 65 but the acute angular areas 64 of the rhombus shape at each of the intersections of the thin-line mesh 63.

When the squeezing direction is $S_1$ shown in FIG. 4, for example, tailing of the electrically conductive ink occurs, which causes thickening (increased width) of thin lines 63b that intersect with the direction $S_1$ at a large intersecting angle, among thin lines 63a and 63b forming the thin-line mesh in two directions, thus impairing the uniformity of the widths of the thin lines 63a and 63b. Therefore, it is preferable that the squeezing direction match the direction of a diagonal of the rhombus shape, shown by $S_0$ in FIG. 4. When the squeezing direction matches the direction of the diagonal of the rhombus shape, uniformity of the widths of the thin lines 63a and 63b is obtained.

Figure 5:
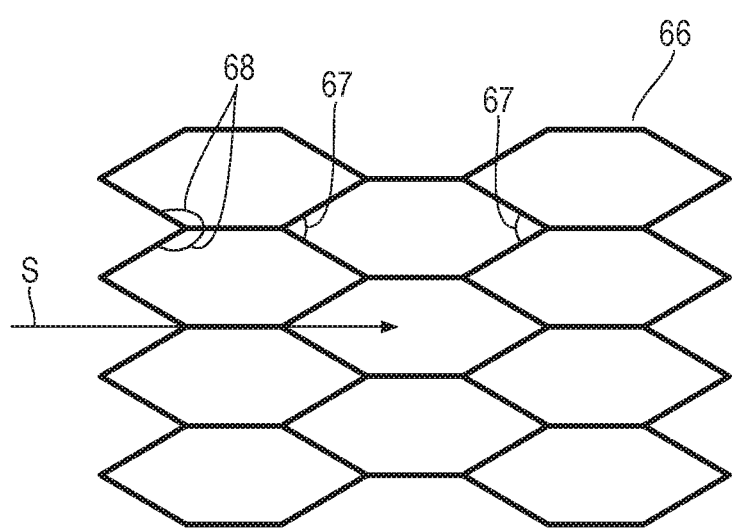
FIG. 5 is a view for explaining a squeezing direction when thin-line mesh has a periodic lattice pattern where a hexagon in which a pair of opposing interior angles are acute angles is a unit lattice.

FIG. 5 shows another example of the thin-line mesh. In this example, the thin-line mesh 66 has a periodic lattice pattern in which a hexagon having a pair of opposing acute interior angles is used as the unit lattice. This lattice pattern can be employed as the thin-line mesh. In the thin-line mesh 66 shown in FIG. 5, the squeezing direction S, which is determined to accord with the direction of the imaginary straight line that passes through not the obtuse angular areas 68 but the acute angular area 67 at intersections of the mesh 66, is set to the direction shown in the figure.

When the conductive part of the sensing area is configured with the thin-line mesh described above in the touch panel, if the rhombus-shaped unit lattice or the hexagonal unit lattice becomes too flat, the density of thin lines in a unit area in the mesh becomes very large, increasing the overall visibility of the conductive part and reducing the feeling of transparency. Therefore, it is preferable that the angles at the acute angular areas 64 and 67 be 50 degrees or more.

The structure of the thin-line mesh and the relationship between the thin-line mesh and the squeezing direction of the doctor blade in the present invention have been described so far. A specific structure of a touch panel manufactured by a manufacturing method according to the present invention will be described below.

Figure 6:
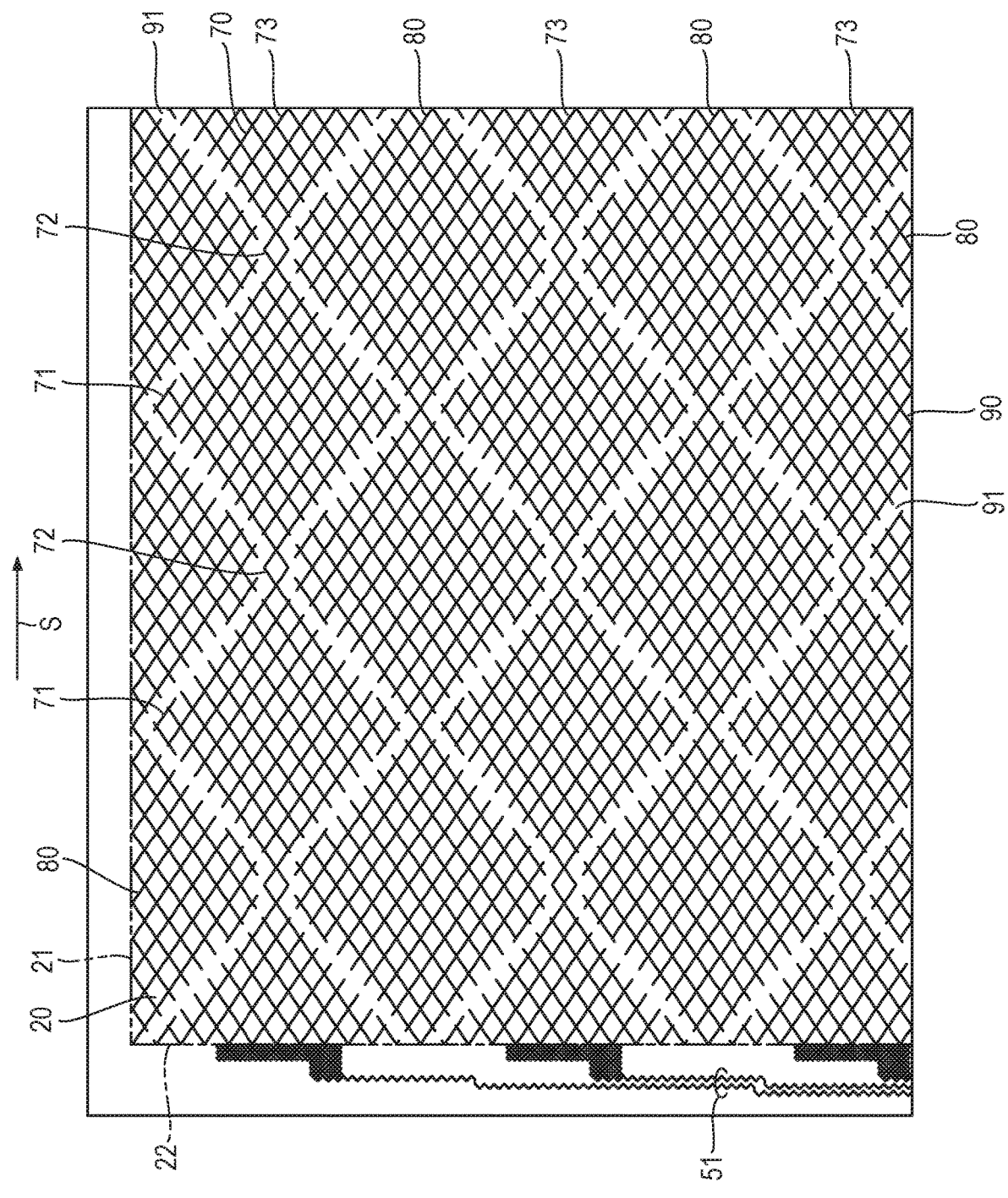
FIG. 6 is a partially enlarged view showing an example of the structure of thin-line mesh in a first conductive layer of a touch panel.
Figure 7:
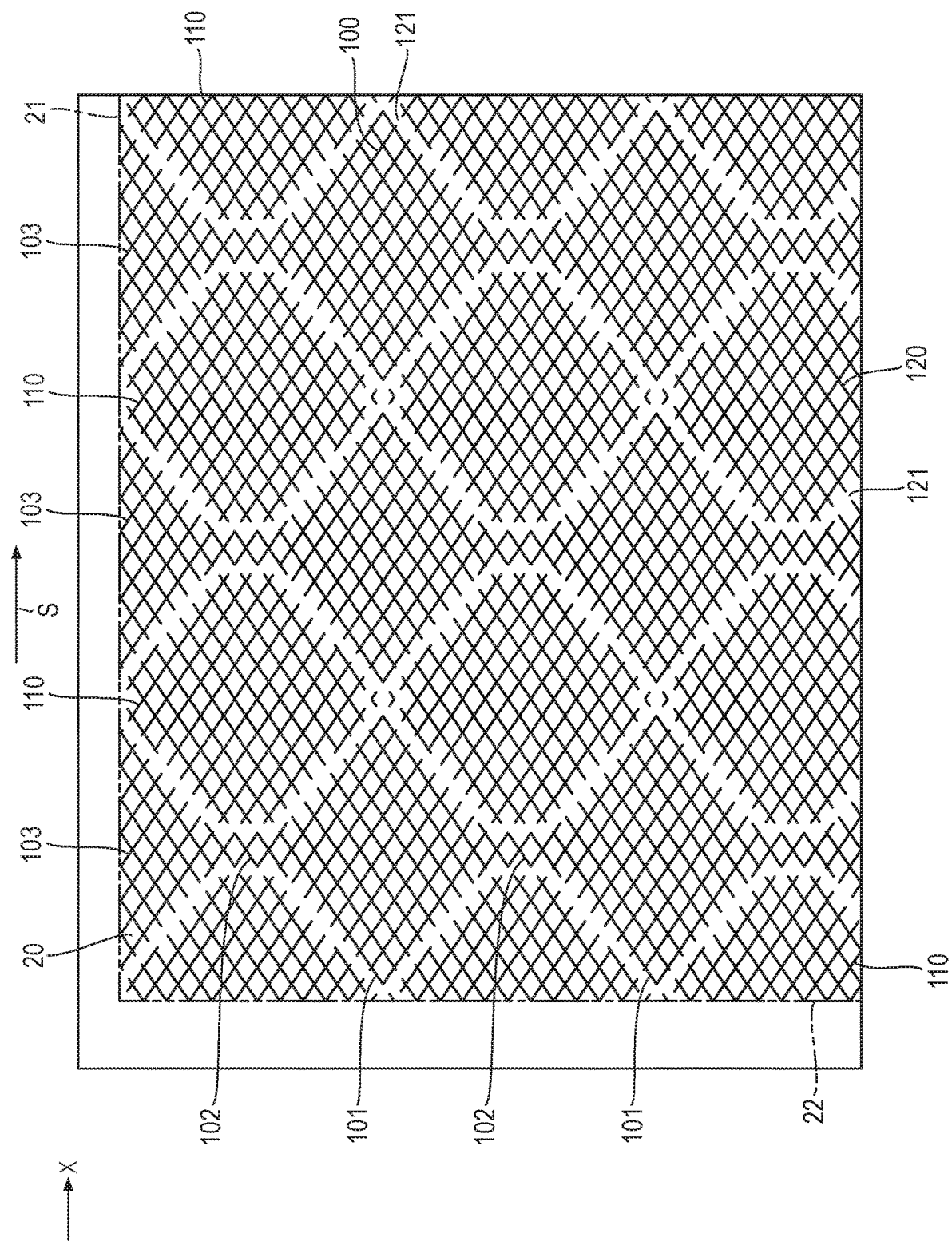
FIG. 7 is a partially enlarged view showing an example of the structure of thin-line mesh of a second conductive layer of the touch panel.
Figure 8:
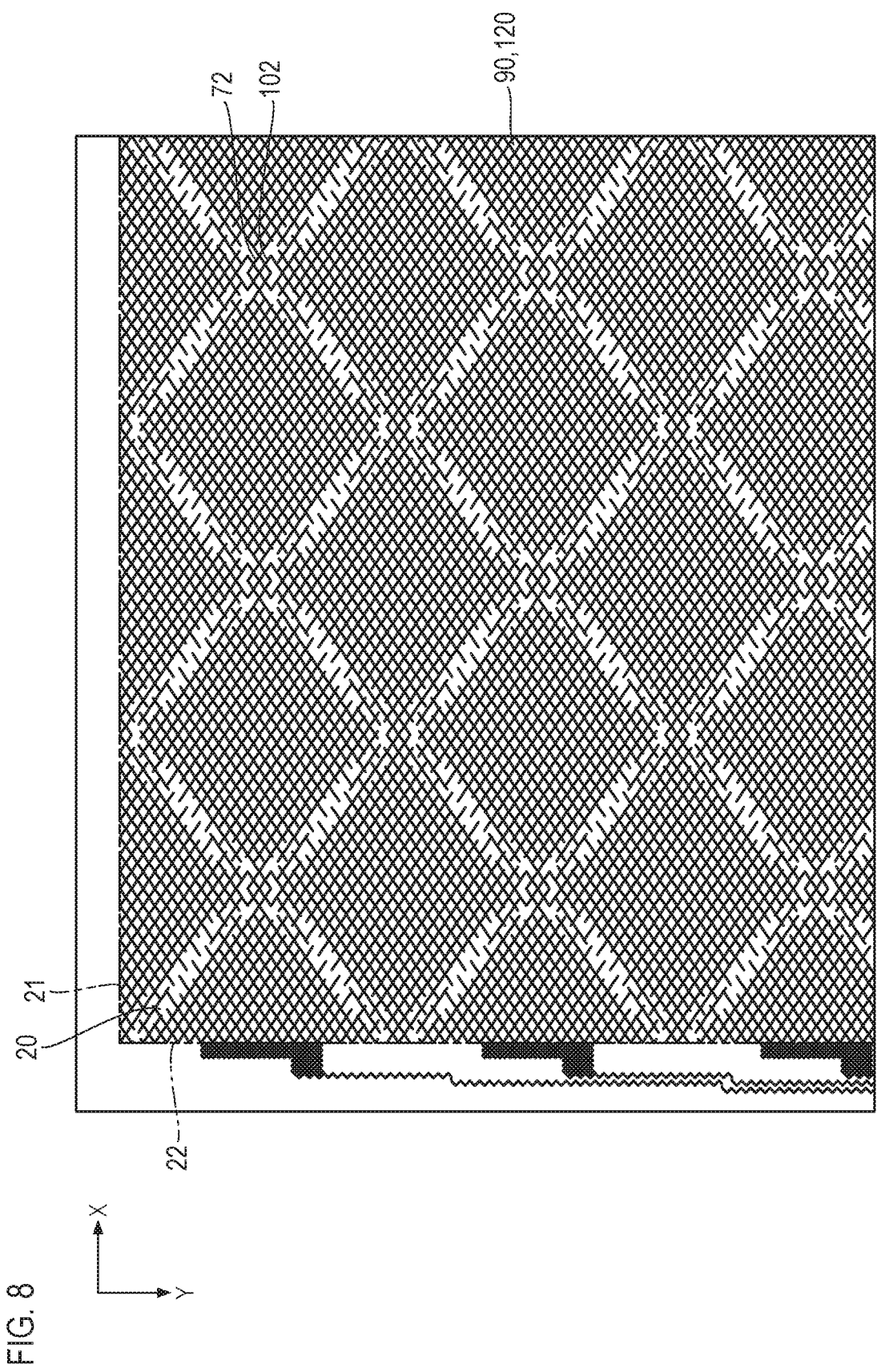
FIG. 8 is a partially enlarged view showing a state in which the thin-line mesh shown in FIG. 6 and the thin-line mesh shown in FIG. 7 are superimposed.

FIGS. 6 to 8 show details of main portions of the structure of a touch panel manufactured according to the present invention.

Figure 1:
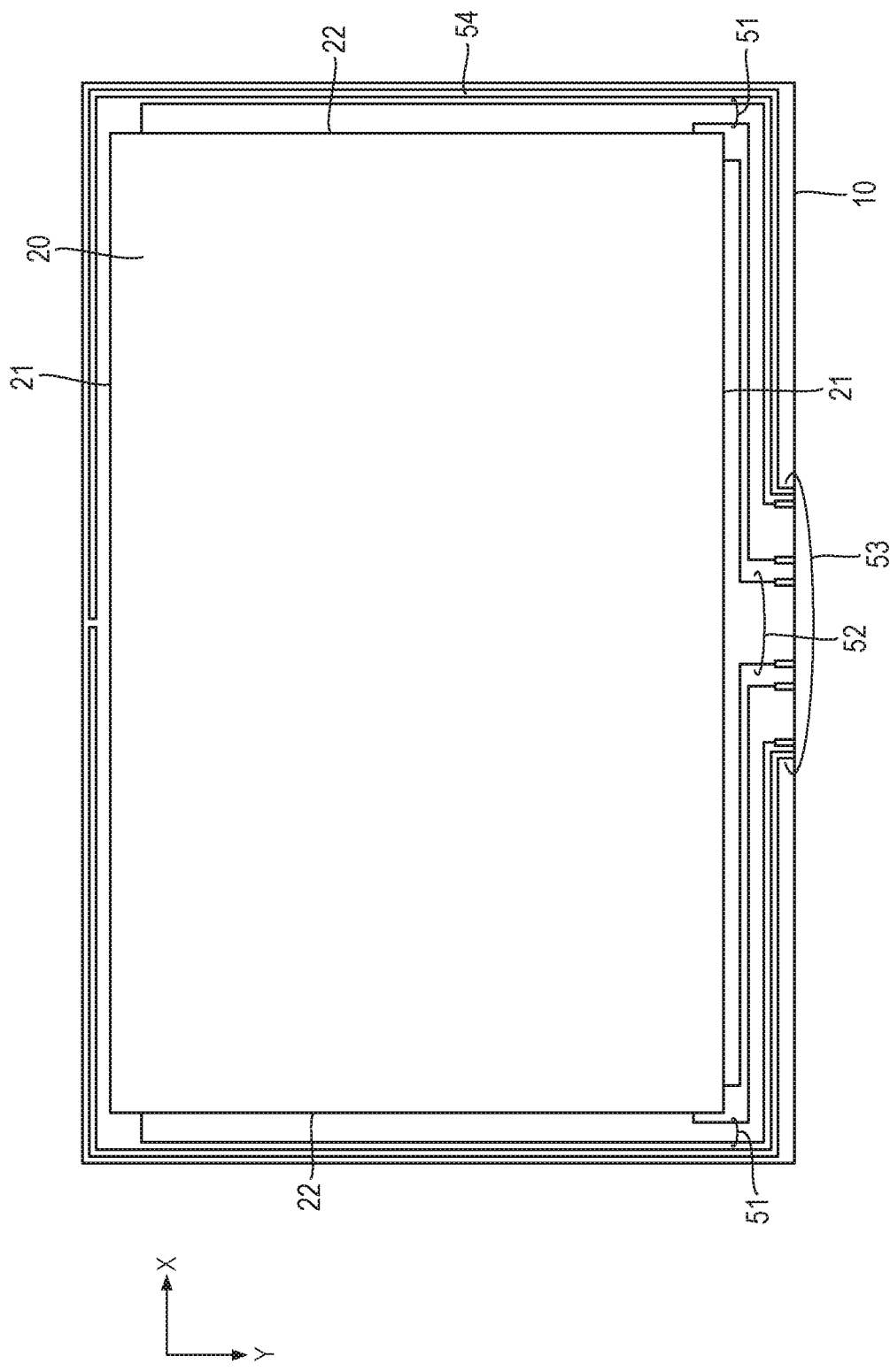
FIG. 1 is a view showing an example of the structure of a touch panel.
Figure 2A:
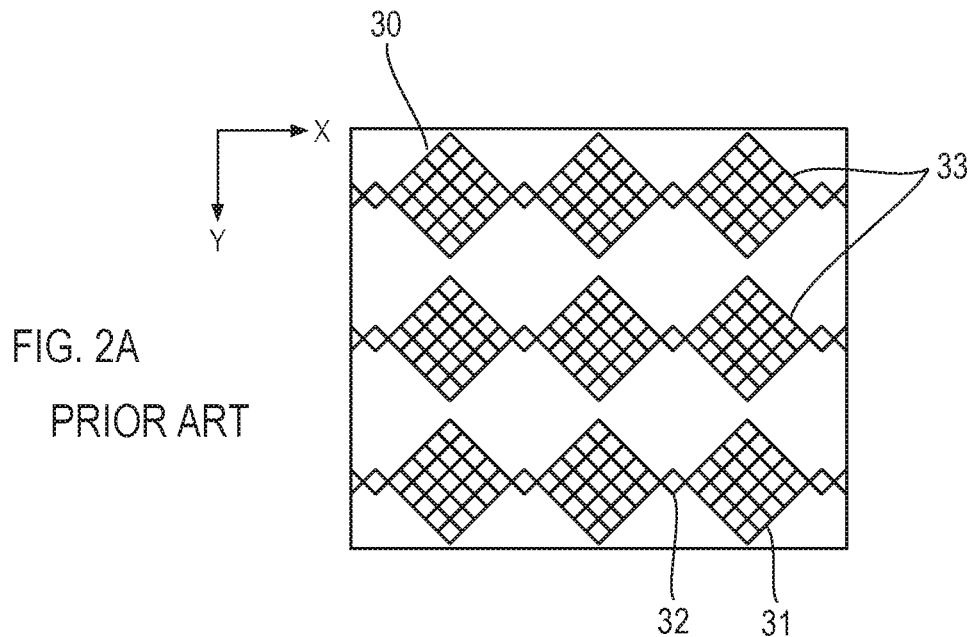
FIG. 2A is a partially enlarged view showing a conventional example of the structure of a first conductive layer of the touch panel.
Figure 2B:
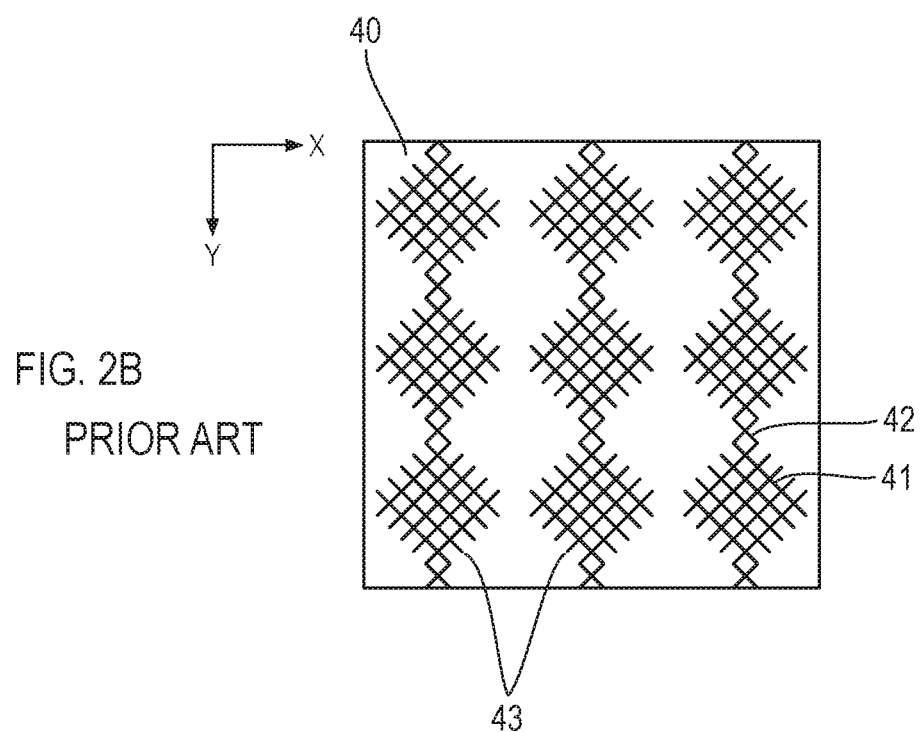
FIG. 2B is a partially enlarged view showing a conventional example of the structure of a second conductive layer of the touch panel.

The touch panel in this example has a structure in which a first conductive layer, an insulating layer, a second conductive layer, and a protective layer are sequentially laminated on one surface of a transparent base member. The insulating layer and the protective layer are made of a transparent material, and the first conductive layer and the second conductive layer are formed by gravure offset printing by using electrically conductive ink that includes electrically conductive particles such as silver particles. This touch panel differs from the conventional example touch panel shown in FIG. 1 in the structure of the sensing area 20. The structures of the portions other than the sensing area 20 are basically the same as those shown in FIG. 1. FIGS. 6 to 8 show details of an upper left part shown FIG. 1.

FIG. 6 shows details of the conductive part of the sensing area 20, formed by the first conductive layer. The conductive part includes a first sensor electrode 70 and a first dummy electrode 80. The first sensor electrode 70 is configured such that a plurality of electrode rows 73 are arranged in rows along a Y direction, each of the plurality of electrode rows 73 being formed by connecting a plurality of island-shaped electrodes 71 arranged along an X direction, with connection sections 72. The first dummy electrode 80 is insulated from the first sensor electrode 70 and is disposed in a region of the sensing area 20 other than a region thereof in which the first sensor electrode 70 is disposed.

Each of the first sensor electrode 70 and the first dummy electrode 80 is made up of thin-line mesh. The first sensor electrode 70 and the first dummy electrode 80 constitute a single continuous periodic thin-line mesh pattern (hereinafter referred to as a first mesh pattern) 90, in which gaps 91 where the thin lines are disconnected are formed at the boundaries between the first sensor electrode 70 and the first dummy electrode 80. In this example, the unit lattice of the first mesh pattern 90 has a rhombus shape of which one side is 400 µm long, and the line width of the thin lines constituting the mesh is 7 µm. The first sensor electrode 70 and the dummy electrode 80 are separated and insulated from each other by about 20 µm at the gaps 91. In FIG. 6, the gaps 91 are shown in relatively enlarged form.

FIG. 7 shows details of the conductive part of the sensing area 20, formed by the second conductive layer. The conductive part includes a second sensor electrode 100 and a second dummy electrode 110. The second sensor electrode 100 is configured such that a plurality of electrode rows 103 are arranged in rows along the X direction, each of the plurality of electrode rows 103 being formed by connecting a plurality of island-shaped electrodes 101 arranged along the Y direction, with connection sections 102. The second dummy electrode 110 is insulated from the second sensor electrode 100 and is disposed in a region of the sensing area 20 other than a region thereof in which the second sensor electrode 100 is disposed.

Each of the second sensor electrode 100 and the second dummy electrode 110 is made up of thin-line mesh. The second sensor electrode 100 and the second dummy electrode 110 constitute a single continuous periodic thin-line mesh pattern (hereinafter referred to as a second mesh pattern) 120, in which gaps 121 where the thin lines are disconnected are formed at the boundaries between the second sensor electrode 100 and the second dummy electrode 110. In this example, the second mesh pattern 120 is the same as the first mesh pattern 90, and the angles made by the thin lines constituting the mesh and the long sides 21 of the sensing area 20 are also the same. In the same manner as in FIG. 6, the gaps 121 are shown in relatively enlarged form.

FIG. 8 shows a state in which the conductive part shown in FIG. 6 and the conductive part shown in FIG. 7 are superimposed, with the insulating layer being sandwiched therebetween. The first mesh pattern 90 of the first conductive layer and the second mesh pattern 120 of the second conductive layer are superimposed such that their unit lattices intersect with each other at middle points, which divides the sides of the rhombus shapes into two halves that are 200 µm long. Therefore, rhombus lattices each having a side length of 200 µm are formed very uniformly in the whole sensing area 20, as shown in FIG. 8. The electrode rows 73 of the first sensor electrode 70 and the electrode rows 103 of the second sensor electrode 100 intersect with each other such that the connection sections 72 and 102 are positioned so as to be superimposed.

In the above-described structure, the first mesh pattern 90 exist uniformly in the sensing area 20 of the first conductive layer where the first sensor electrode 70 is formed, and the second mesh pattern 120 exist uniformly in the sensing area 20 of the second conductive layer where the second sensor electrode 100 is formed. Therefore, visual contrast caused by whether the thin-line mesh exist or not does not occur in either the first conductive layer or the second conductive layer. Consequently, visual contrast does not occur even in the state where the first conductive layer and the second conductive layer are superimposed, completely eliminating contrast in the sensing area 20.

In addition, the squeezing directions S of the doctor blade for the printing plate that defines the first mesh pattern 90 and for the printing plate that defines the second mesh pattern 120 are along the X direction, which is parallel to the long sides 21 of the sensing area 20, as shown in FIG. 6 and FIG. 7, greatly reducing the size of the blurred region of the electrically conductive ink that occurs at intersections of the thin-line mesh, described before.

Therefore, with these improvements, a touch panel having no effect on the visibility of the display unit, having a good appearance, and being visually superior can be obtained.

As described above, the first mesh pattern 90 and the second mesh pattern 120 are superimposed such that their unit lattices intersect with each other at the middle points, which divides the sides of the rhombus shapes into two halves that are 200 µm long. Therefore, the thin lines constituting the first mesh pattern 90 and the thin lines constituting the second mesh pattern 120 are not positioned close to each other, which prevents the occurrence of a problem in that a pair of adjacent thin lines draw a relatively thick line that is visually recognized, as if they were one thick line.

The structure of the conductive part of the sensing area 20, formed by the first conductive layer, shown in FIG. 9, and the structure of the conductive part of the sensing area 20, formed by the second conductive layer, shown in FIG. 10, will be described next.

Figure 9:
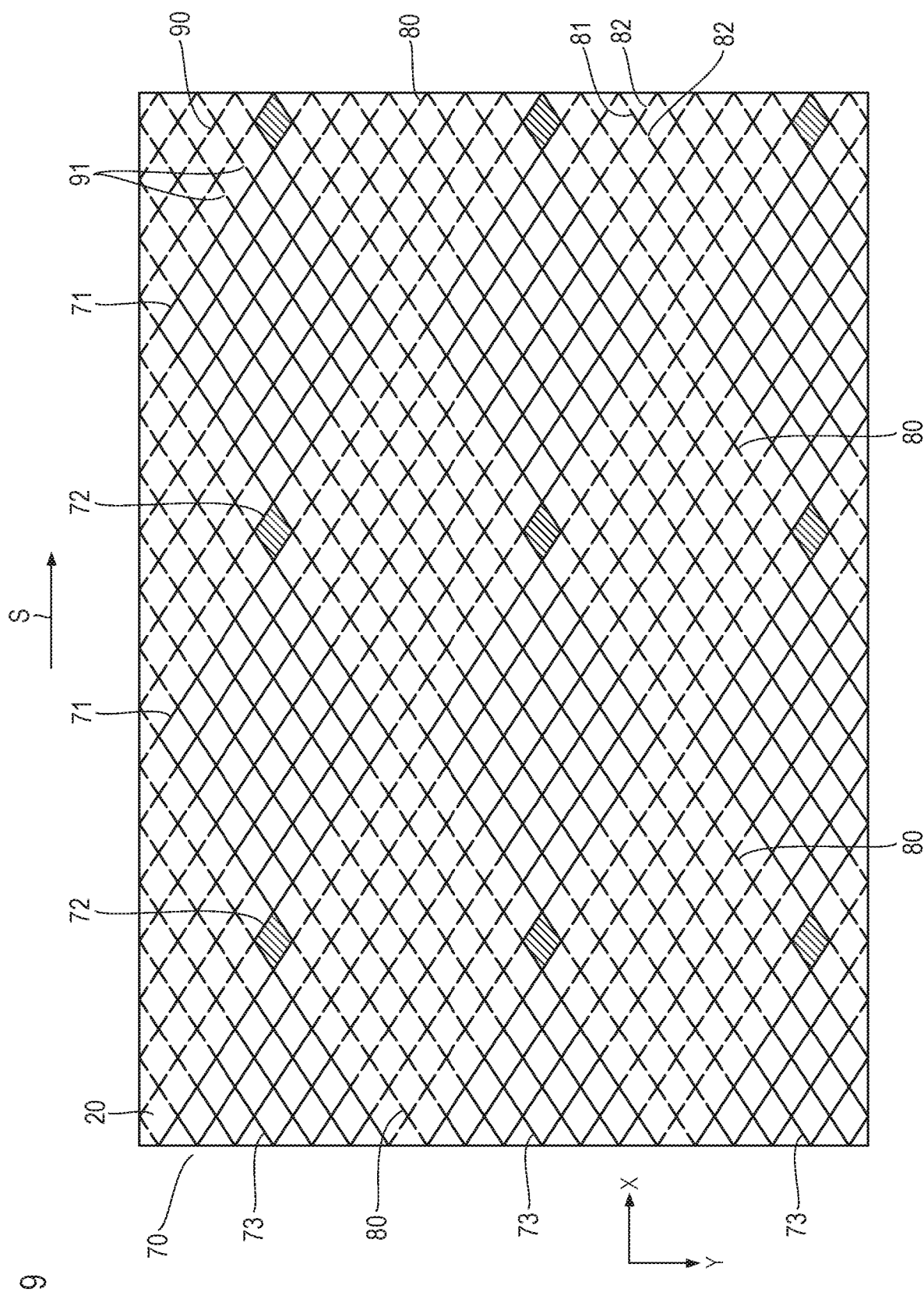
FIG. 9 is a partially enlarged view showing another example of the structure of the thin-line mesh in the first conductive layer of the touch panel.
Figure 10:
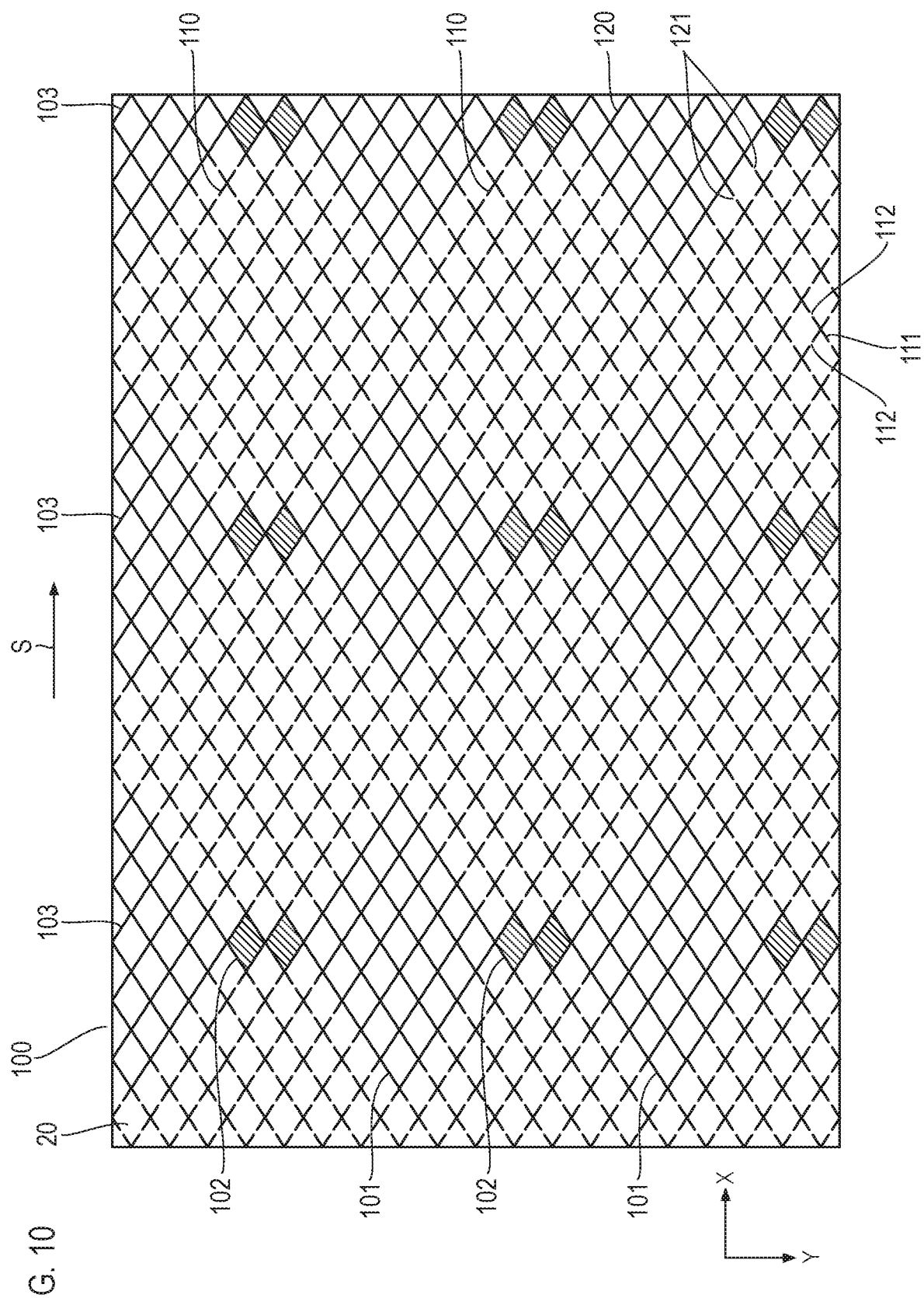
FIG. 10 is a partially enlarged view showing another example of the structure of the thin-line mesh in the second conductive layer of the touch panel.

The structures shown in FIGS. 9 and 10 differ from those shown in FIGS. 6 and 7, described before, in the structure of dummy electrodes. Portions corresponding to those shown in FIGS. 6 and 7 are assigned the same numerals, and detailed descriptions thereof will be omitted. In FIG. 9 and FIG. 10, the areas where the connection sections 72 of the first sensor electrode 70 are positioned and the areas where the connection sections 102 of the second sensor electrode 100 are positioned are hatched.

In this example, the first dummy electrode 80 is formed of the arrangement of first unit patterns 81 insulated from each other, as shown in FIG. 9, and the second dummy electrode 110 is formed of the arrangement of second unit patterns 111 insulated from each other, as shown in FIG. 10. The first unit patterns 81 and the second unit patterns 111 both have a letter-X shape in which two thin lines intersect, and gaps 82 and 112 provided respectively between adjacent first unit patterns 81 and between adjacent second unit patterns 111 are both 20 μm long.

When the first dummy electrode 80 and the second dummy electrode 110 are both formed of the arrangements of the first unit patterns 81 and the second unit patterns 111 insulated from each other, respectively, the following advantages can be obtained.

Even if a short circuit (an insulation defect) occurs partially between the first sensor electrode 70 and the first dummy electrode 80 or between the second sensor electrode 100 and the second dummy electrode 110 because of a problem that is difficult to avoid, such as electrically conductive foreign matter becoming mixed during printing or a case in which the solvent of the electrically conductive ink is not sufficiently absorbed by the blanket due to swelling of the blanket in gravure offset printing, causing the electrically conductive ink to be transferred and printed while the ink is still soft, only one unit pattern which is adjacent to the sensor electrode and where an insulation defect occurs is short-circuited with the sensor electrode, allowing the change (extension) of the detecting area of the sensor electrode and the change of the capacitance of the sensor electrode to be suppressed to a minimum.

Therefore, when the touch panel has the structures shown in FIGS. 9 and 10, the touch panel has a visually superior quality in the same way as the touch panel having the structures shown in FIGS. 6 to 8, described before. In addition, even if an insulation defect occurs, the effect of the defect on the performance of the touch panel is suppressed to a minimum.

What is claimed is:

1. A method for manufacturing a touch panel having a sensing area that includes a conductive part made up of thin-line mesh, the method comprising:

designing the thin-line mesh, the thin-line mesh including a plurality of intersections, such that a plurality of thin lines converge at the intersection, wherein the intersection forms therearound an acute angular area and an obtuse angular area, the acute angular area being defined between a pair of adjacently converging thin lines that forms an acute angle therebetween, the obtuse angular area being defined between a pair of adjacently converging thin lines that forms an obtuse angle therebetween;

filling electrically conductive ink into a printing plate by a squeezing process using a doctor blade, the printing plate having a groove pattern that conforms with the thin-line mesh, wherein the doctor blade is moved along a squeezing direction, such that an imaginary straight line that passes through the intersection in the thin-line mesh in a direction in accordance with the squeezing direction, passes through not the obtuse angular area but the acute angular area; and forming the conductive part by printing, in which the electrically conductive ink is transferred to a surface of a base member.

2. The method for manufacturing a touch panel according to claim 1, wherein:

the acute angular area comprises an opposing pair of acute angular areas;

the obtuse angular area comprises an opposing pair of obtuse angular areas; and the thin-line mesh has a periodic lattice pattern which has a unit lattice having a rhombus shape, the unit lattice containing the opposing pair of the acute angular areas and the opposing pair of the obtuse angular areas.

3. The method for manufacturing a touch panel according to claim 2, wherein the squeezing direction is selected such that the imaginary straight line is aligned with a diagonal of the unit lattice.

4. The method for manufacturing a touch panel according to claim 2, wherein the acute angle is 50 degrees or more.

5. The method for manufacturing a touch panel according to claim 3, wherein the acute angle is 50 degrees or more.

6. The method for manufacturing a touch panel according to claim 1, wherein the conductive part includes a sensor electrode and a dummy electrode, the dummy electrode being insulated from the sensor electrode, such that the dummy electrode is disposed in a region of the sensing area other than a region thereof in which the sensor electrode is disposed, wherein the sensor electrode and the dummy electrode constitute a single continuous periodic thin-line mesh pattern.

7. The method for manufacturing a touch panel according to claim 6, wherein:

the acute angular area comprises an opposing pair of acute angular areas;

the obtuse angular area comprises an opposing pair of obtuse angular areas; and the single continuous periodic thin-line mesh pattern has a unit lattice having a rhombus shape, the unit lattice containing the opposing pair of the acute angular areas and the opposing pair of the obtuse angular areas.

8. The method for manufacturing a touch panel according to claim 7, wherein the squeezing direction is selected such that the imaginary straight line is aligned with a diagonal of the unit lattice.

9. The method for manufacturing a touch panel according to claim 7, wherein the acute angle is 50 degrees or more.

10. The method for manufacturing a touch panel according to claim 8, wherein the acute angle is 50 degrees or more.

* * * * *